United States Patent [19]

Shrestha et al.

[11] Patent Number: 4,558,285

[45] Date of Patent: Dec. 10, 1985

[54] IMPEDANCE-MATCHING DEVICE FOR POWER AMPLIFIER CIRCUIT

[75] Inventors: Mukunda B. Shrestha; Geoffrey N. Mendenhall, both of Quincy, Ill.

[73] Assignee: Broadcast Electronics, Inc., Quincy, Ill.

[21] Appl. No.: 598,040

[22] Filed: Apr. 9, 1984

[51] Int. Cl.[4] ............................ H03F 3/60; H03H 7/38
[52] U.S. Cl. ............................................ 330/53; 333/32
[58] Field of Search ........................... 330/53, 286, 54; 333/32

[56] References Cited

U.S. PATENT DOCUMENTS 3,703,685 11/1972 Simopoulos et al. ............... 330/286
4,091,345 5/1978 Yano et al. ............................ 333/32

Primary Examiner—James B. Mullins
Assistant Examiner—G. Wan
Attorney, Agent, or Firm—Hill, Van Santen, Steadman & Simpson

[57] ABSTRACT

A broad-band impedance-matching device for an RF vacuum tube power amplifier incorporates a circuit having multiple inductors and capacitors interconnected in an impedance-matching circuit, said circuit having a low impedance input and high impedance output and made up of a plurality of series connected inductors and capacitors. Impedance transformation is performed in a number of small steps, which enables the use of a much lower cue than would be necessary if the impedance transformation were done in a single step. The arrangement produces an impedance transformation which holds over a relatively broad band width, making in unnecessary for any fine tuning of the network.

9 Claims, 4 Drawing Figures

IMPEDANCE-MATCHING DEVICE FOR POWER AMPLIFIER CIRCUIT

BACKGROUND

1. Field of the Invention

The present invention relates to an impedance-matching device for an RF transmitter power amplifier circuit, and more particularly to an impedance-matching device in the form of a printed circuit which does not require any adjustment over the 88–108 MHz FM broadcast band.

2. Prior Art

It is common to provide an impedance-matching device between the input of an RF transmitter power amplifier stage and the output of an RF intermediate power amplifier stage. These matching devices are generally in the form of L, T or $\pi$ networks, and sometimes incorporate inductive coupling. The choice of which circuit to use is made on the basis of other components, and circuit parameters which are independent of impedance-matching considerations. All of such prior art circuits require adjustment of one or more circuit elements to satisfactorily provide an impedance-match over a specified range of frequencies and RF power levels. For example, a typical prior art impedance-matching device may incorporate a series coil having a variable inductance which is adjustable by moving a slug within the coil, using mechanical linkages such as gears and the like, for control from the front panel of the transmitter. This type of arrangement is relatively complicated and requires adjustments. In general, such circuits are not characterized by high reliability, because the mechanical linkages are not particularly stable, and the elements of such linkages are sometimes sensitive to vibration and may be michrophonic.

BRIEF DESCRIPTION OF THE INVENTION

It is a principal object of the present invention to provide a circuit which provides a broad band impedance-matching for the high input impedance of a vacuum-tube power amplifier stage to the relatively low output impedance of an RF intermediate power amplifier stage in a transmitter.

It is another object of the present invention to provide apparatus for furnishing a broad band impedance match which is implemented as a printed circuit with inductors and capacitors.

A further object of the present invention is to provide apparatus for a broad band impedance-match in which the inductor and capacitor components do not require any adjustments.

BRIEF DESCRIPTION OF THE DRAWINGS

Reference will now be made to the accompanying drawings in which.

DESCRIPTION OF THE PREFERRED EMBODIMENT

Figure 1:
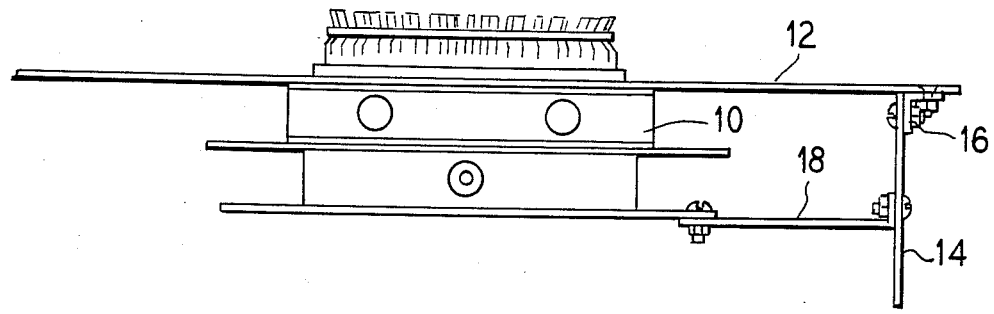
FIG. 1 is a side elevational view of an RF transmitter tube assembly incorporating the present invention.

Referring to FIG. 1, there is shown an assembly including an RF power amplifier tube socket, and a printed circuit board incorporating an illustrative embodiment of the present invention. The power amplifier tube socket 10 is supported by a conductive metal base 12, which serves as the signal ground and RF ground for the circuit. A circuit board 14 incorporating an impedance-matching circuit is attached to the sheet 12 by means of a bracket 16, and a conductive strap 18 is bolted at one end to the circuit board, and at the other end to the input of the power amplifier tube 10 socket.

Figure 2:
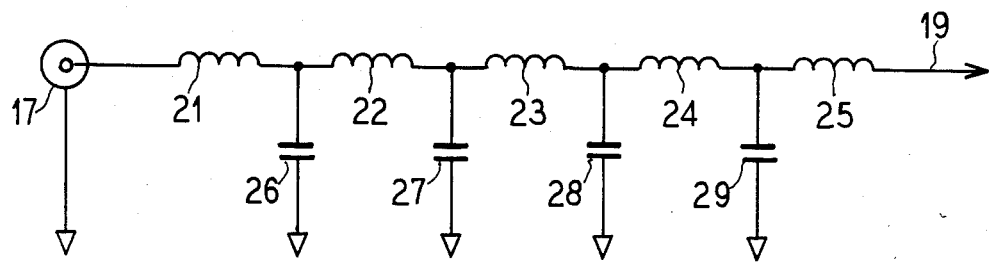
FIG. 2 is a schematic circuit diagram of a circuit employed in the apparatus of FIG. 1.

FIG. 2 illustrates a schematic circuit diagram of the impedance-matching circuit. It incorporates five series connected inductor elements 21–25, and four capacitors 26–29 each connected between ground and the junction of two of the series connected capacitors. The RF input 17 at a low impedance is connected to one end of the inductor 21, and the RF output 19 (at a high impedance) is connected to one end of the inductor 25 at the other end of the series string. The output inductor 25 consists of two parts, a etched part present on the circuit board, and the strap by which the output is connected to the input of the power amplifier.

Figure 3:
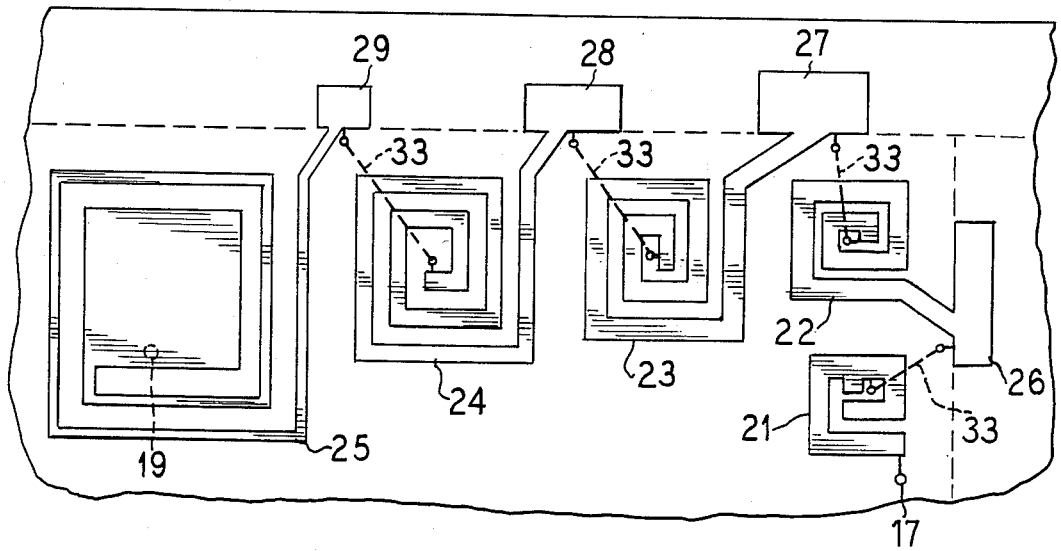
FIGS. 3 and 4 show the front and a portion of the back of a circuit board for the circuit of FIG. 3.
Figure 4:
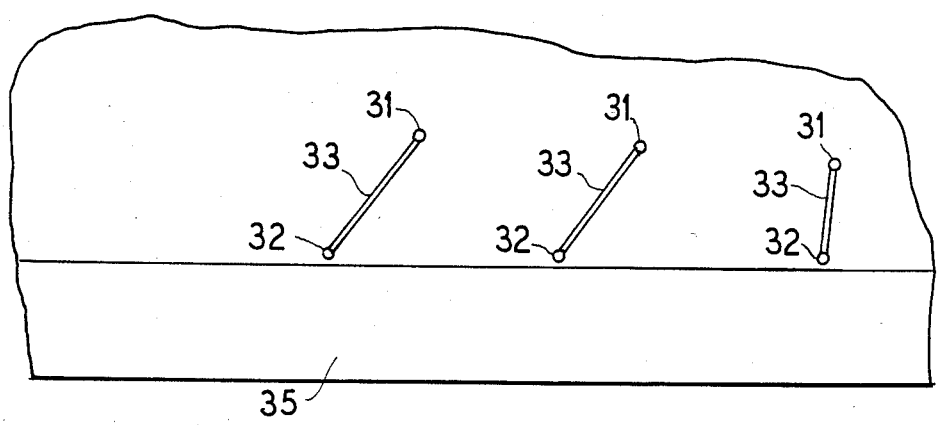

FIG. 3 shows a plan view of the printed circuit board illustrating the manner in which the inductors (the coils) and capacitors (the rectangles or plates) are etched on the printed circuit board. FIG. 4 shows the reverse side of the board, and illustrates the manner in which connections are made between the components of the board. The center of each inductor coil is connected to a conductive turret 31 extending through the circuit board to a point spaced from the surface on the other side. The plates of the capacitors are each similarly connected through the board by turrets 32 to a point spaced from the surface of the board, and the turrets are interconnected by conductors 33 extending between the turrets and spaced from the conductive surface 35 of circuit board, which forms a ground plane under only the capacitors 27–29.

No input loading control is required, such as is typically necessary in conjunction with an input tuning control of a conventional device.

By use of the present invention, it is possible to provide a good impedance-match between the low output impedance of an intermediate amplifier and the high input impedance of an RF power amplifier. The range of frequencies for which the impedance is matched extends over a relatively wide band width, for example, the FM broadcast band, and the apparatus of the present invention is characterized by relatively high reliability and stability in operation.

The RF power amplifier tube employs a conventional control for tuning out the effect of the internal capacitance of the tube. However, because of the broad bandwidth of the impedance-matching device of the present invention, no adjustment of the impedance-matching device is required. Since the present invention does not require any input loading control, the usual interaction between a tuning control and a loading control is avoided. This interaction has been a difficulty with prior art devices, since the adjustment of one control requires a readjustment of the other and vice versa. The use of a single tuning control in the input circuit of the RF power amplifier reduces the time and complexity of transmitter tuning procedures.

The connection of the present apparatus to the input of a RF power amplifier by means of a conductive rigid strap avoids the mechanical linkages employed in the prior art which are required to accomplish the impedance-matching over the FM broadcast band at different power levels. In eliminating such adjustable mechanical arrangements, the apparatus of the present invention provides greater reliability and stability, while at the same time being less costly to manufacture and assemble.

In one embodiment of the present invention, the printed circuit board comprises a copper-clad teflon-glass laminate without ground plane. The components of the circuit board are interconnected by means of lengths of wire which are soldered to the turrets.

In an alternative embodiment, the apparatus of the present invention may be constructed using conventional lumped inductors and capacitors rather than providing such components in circuit board form. It is also possible to alternatively construct the impedance-matching device by using micro-strip techniques.

From the foregoing, it will be apparent that the apparatus of the present invention is simple and economical to manufacture, and achieves many desirable operational characteristics. The fact that it does not use any variable components, makes its manufacture and assembly much easier than alternative techniques of impedance-matching, and the apparatus of the present invention is able to obtain an optimum impedance-match between the 50 ohm impedance of a solid state driver stage and the 450 to 500 ohm impedance input of a vacuum tube RF power amplifier over a 4:1 range of RF power levels.

In a typical embodiment, using an Eimac power amplifier type 4CX3500A, the inductors 21-25 had an inductive reactance at 98 M Hz. of about 45, 65, 120, 200 and 300 ohms, respectively, while the capacitors 26-29 had a capacitive reactance of 90, 115, 170 and 400 ohms, respectively. The measured input return loss of the vacuum tube power amplifier is between 28 and 30 dB, over a range of 50 to 250 watts.

The present invention achieves substantial structural rigidity, too, which eliminates any tendency toward vibration sensitivity. This improves operation over prior art devices which have separately mounted components which can be microphonic.

It is apparent that others skilled in the art may develop various modifications and additions in the apparatus of the present invention without departing from the essential features of novelty thereof, which are intended to be defined and secured by the appended claims.

What is claimed is:

1. A broad-band impedance-matching device for an RF vacuum tube power amplifier comprising a circuit having multiple inductors and capacitors interconnected in an impedance-matching circuit, said circuit incorporating a plurality of series connected inductors extending between a low impedance input and a high impedance output, and a plurality of capacitors each connected between a reference potential and the junction between individual pairs of said inductors.

2. Apparatus according to claim 1, including five series-connected inductors and four capacitors.

3. Apparatus according to claim 1, including a calibrated strap for connecting said high impedance output directly to the input of said RF vacuum tube.

4. Apparatus according to claim 1, wherein said circuit is formed on a printed circuit board, said inductors comprising planar coils without ground plane on said board and said capacitors comprising conductive surfaces on said board.

5. Apparatus according to claim 4, including connecting means including a plurality of turrets extending outwardly from said printed circuit board, conductive means interconnecting said turrets, and means for connecting individual ones of said turrets to said inductors and capacitors.

6. Apparatus according to claim 4 including conductive bracket means for mounting said circuit board directly to a conductive member at ground potential, said bracket serving both as a mechanical support for said circuit board and as a ground connection therefor.

7. Apparatus according to claim 1, wherein said inductors are connected in series between said input and said output and have different values of inductive reactance, which reactance increases for inductors connected closer to said output.

8. Apparatus according to claim 7, wherein said capacitors are each connected between a reference potential and junctions between adjacent ones of said inductors, said capacitors having different values of capacitive reactance, said capacitive reactance increasing for capacitors which are connected closer to said output.

9. Apparatus according to claim 1, wherein said inductors and capacitors are sized to provided multiple impedance transforms in small steps, each of said impedance transforms being a fraction of the transformation in impedance between said input and said output, whereby impedance matching is accomplished over a broad bandwidth.

* * * * *